United States Patent
Huang et al.

(10) Patent No.: US 10,551,425 B2
(45) Date of Patent: Feb. 4, 2020

(54) METHOD FOR QUICKLY IDENTIFYING DISCONNECTION OF CT IN PROTECTION OF 3/2 CONNECTION MODE BASED BUS

(71) Applicants: XJ GROUP CORPORATION, Xuchang (CN); XJ ELECTRIC CO., LTD, Xuchang (CN); Xuchang XJ Software Technology Co., Ltd., Xuchang (CN); State Grid Corporation of China, Beijing (CN)

(72) Inventors: Jidong Huang, Xuchang (CN); Chuankun Ni, Xuchang (CN); Hui Tang, Xuchang (CN); Zhiyong Wang, Xuchang (CN); Feng Xiao, Xuchang (CN); Shasha Hu, Xuchang (CN); Yun Gong, Xuchang (CN); Guangjie Feng, Xuchang (CN); Shusheng Li, Xuchang (CN); Ning Yang, Xuchang (CN); Yanhai Zhang, Xuchang (CN)

(73) Assignees: XJ GROUP CORPORATION, Xuchang, Henan (CN); XJ ELECTRIC CO., LTD., Xuchang, Henan (CN); XUCHANG XJ SOFTWARE TECHNOLOGY CO., LTD., Xuchang, Henan (CN); STATE GRID CORPORATION OF CHINA, Beijing (CN)

( * ) Notice: Subject to any disclaimer, the term of this patent is extended or adjusted under 35 U.S.C. 154(b) by 603 days.

(21) Appl. No.: 15/358,222

(22) Filed: Nov. 22, 2016

(65) Prior Publication Data
US 2017/0192045 A1    Jul. 6, 2017

(30) Foreign Application Priority Data

Jan. 4, 2016   (CN) .......................... 2016 1 0002985

(51) Int. Cl.
*G01R 31/02* (2006.01)

(52) U.S. Cl.
CPC .................................. *G01R 31/027* (2013.01)

(58) Field of Classification Search
CPC .. G01R 31/027; G01R 31/1227; G01R 31/12; G01R 35/02; G01R 31/025; G01R 31/02
See application file for complete search history.

(56) References Cited

U.S. PATENT DOCUMENTS 5,627,712 A * 5/1997 Wilkinson .......... G06F 11/1435
361/36

FOREIGN PATENT DOCUMENTS

| CN | 1964149 A | 5/2007 |
| CN | 101938117 A | 1/2011 |

(Continued)

OTHER PUBLICATIONS

Zhen-Feng et al., "Discussing some special problems about application of teed line differential protection", Power System Protection and Control, vol. 37, No. 17, Sep. 1, 2009, pp. 57-59 and 64.

(Continued)

*Primary Examiner* — Jermele M Hollington
*Assistant Examiner* — Suresh K Rajaputra
(74) *Attorney, Agent, or Firm* — Syncoda LLC; Feng Ma

(57) ABSTRACT

The present disclosure relates to a method for quickly identifying disconnection of a Current Transformer (CT) in protection of a 3/2 connection mode based bus. The present disclosure can quickly and accurately identify the disconnection of the CT, thereby avoiding the problem of a maloperation in protection of a bus caused by the disconnection of the CT.

7 Claims, 1 Drawing Sheet

(56) References Cited

FOREIGN PATENT DOCUMENTS

| | | |
|---|---|---|
| CN | 102004208 A | 4/2011 |
| CN | 102684145 A | 9/2012 |
| CN | 105093058 A | 11/2015 |
| JP | 2011101518 A | 5/2011 |

OTHER PUBLICATIONS

Huang, et al., "Re-tripping Discrimination of Bus Differential Protection When External Fault Transforms to Internal Fault", Automation of Electric Power Systems, vol. 38, No. 18, Sep. 25, 2014, pp. 120-124.

Wang et al., "High Current Blocking Design of Protective Devices at Low-voltage Side of Ultra-high Voltage Station", Automation of Electric Power Systems, vol. 38, No. 7, Apr. 10, 2014, pp. 123-126.

\* cited by examiner

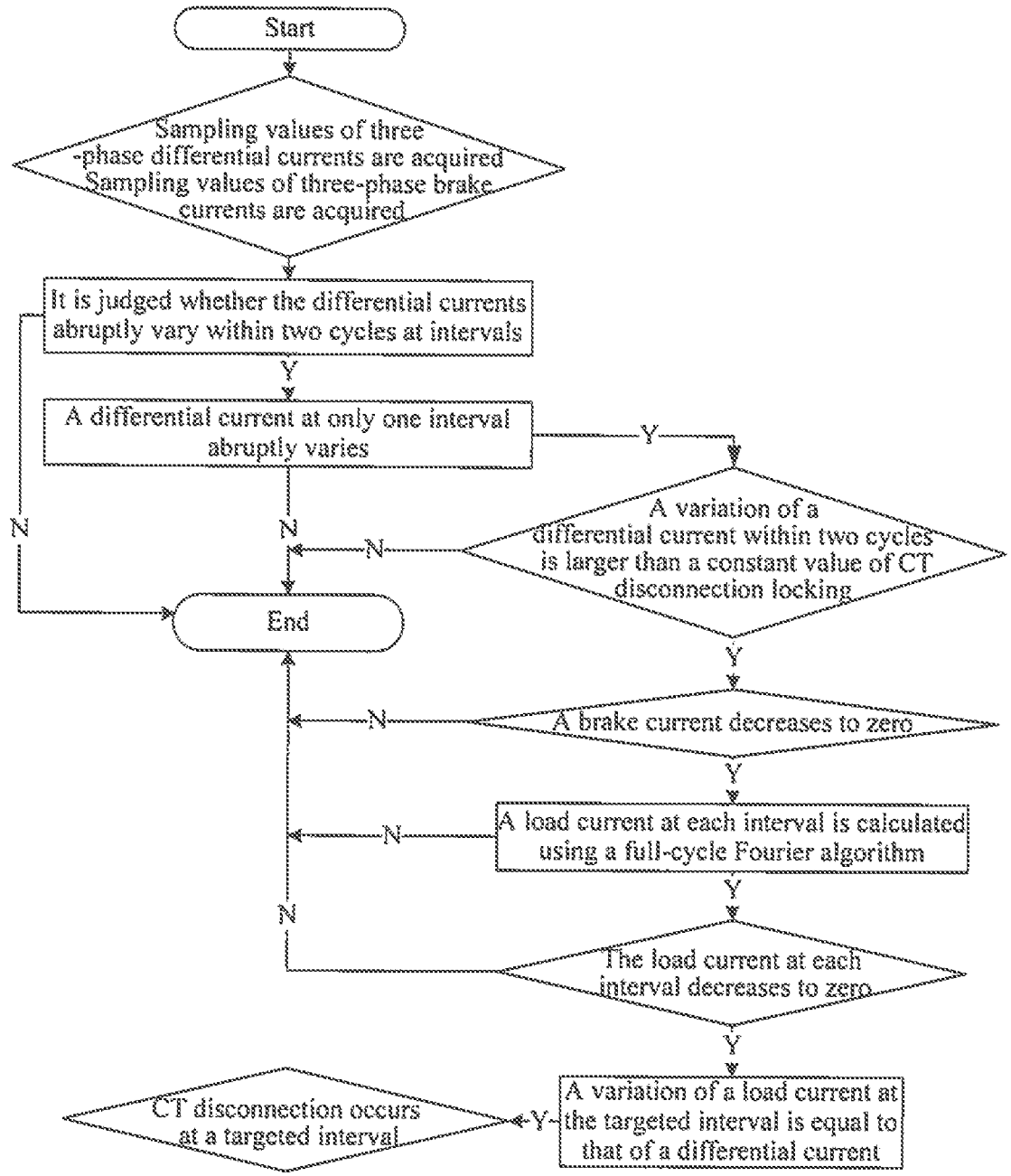

METHOD FOR QUICKLY IDENTIFYING DISCONNECTION OF CT IN PROTECTION OF 3/2 CONNECTION MODE BASED BUS

This application claims the benefit of China Patent Application Serial No. 201610002985.0, filed Jan. 4, 2016, which is hereby incorporated by reference in its entirety.

FIELD

The present disclosure relates to a method for quickly identifying disconnection of Current Transformer (CT) in protection of a 3/2 connection mode based bus, and belongs to the technical field of a judgment on a fault of a power system.

BACKGROUND

As the structure of a power grid is increasingly compact, stable running of the power grid appears particularly important. For example, a 3/2 connection mode is adopted for a bus of 1000 kV, 750 kV or 500 kV. The reliability of the connection mode in supplying power is higher. Even if a certain circuit breaker trips or a certain protection maloperates, the reliability in supplying power will not be influenced. Accordingly, composite voltage locking is typically not configured for differential protection of 3/2 connection mode based bus protection. Moreover, the composite voltage locking serving as a maloperation measure of the differential protection cannot play a role in protection of the 3/2 connection mode based bus.

In a newly-built substation, the number of strings of a 3/2 connection mode bus is 2 to 4, and under most circumstances, the number is 2. If there are only 2 strings, in the case where composite voltage locking is not configured, after a branch CT is disconnected, a differential current caused by CT disconnection is equal to a load current of the other string. In such case, owing to the brake characteristic of differential protection, it is difficult to brake the differential protection, thereby causing maloperation of the differential protection due to the CT disconnection. Therefore, since composite voltage locking is not adopted for the differential protection of existing domestic 3/2 connection mode based bus protection and there exists an upper limit of the number of times for reliable tripping of a high voltage circuit breaker, how to prevent maloperation of 3/2 connection mode based bus protection during CT disconnection becomes a problem to be urgently solved.

SUMMARY

To overcome the defects in the conventional art, the present disclosure provides a method for quickly identifying disconnection of a CT in protection of 3/2 connection mode based bus, capable of solving the technical problem of a maloperation in protection of a high voltage bus caused by disconnection of a CT disconnection.

The present disclosure is implemented by the solutions as follows.

A method for quickly identifying disconnection of a CT in protection of 3/2 connection mode based bus includes the following steps:

Step 1, collecting currents of all running branches on a current bus, calculating a current differential current and brake current, then judging, interval by interval, whether a load current abruptly varies, and if the load current of only one branch abruptly varies, targeting the interval;

Step 2, judging whether a variation of the current differential current in Step 1 is larger than a constant value of CT disconnection locking, and judging whether a variation of the current brake current meets a feature of decreasing;

Step 3, judging whether the targeted interval in Step 1 varies from a state in which there is the load current to a state in which there is no current, and judging whether a variation in a current load current per cycle of the targeted interval is equal to a variation in a current differential current per cycle;

Step 4 if the above judgment conditions in Steps 2 and 3 are met, judging that the disconnection of the CT occurs at the targeted interval.

Further, the differential current in Step 1 is a vector sum of the currents of all the branches, and the brake current is a scalar sum of the currents of all the branches.

Further, a criterion for judging whether the variation of the current differential current is larger than the constant value of CT disconnection locking in Step 2 is as follows:

$$|I_{cd(i)}-I_{cd(i-2T)}|>|I_{cd(i-2T)}-I_{cd(i-4T)}|+I_{CT\ disconnection\ locking\ constant\ value},$$

where $I_{cd(i)}$ is a value of the current differential current, $I_{cd(i-2T)}$ is a value of a differential current of a cycle which is located before the current cycle and separated from the current cycle by one cycle, $I_{cd(i-4T)}$ is a value of a differential current of a cycle which is located before the current cycle and separated from the current cycle by three cycles, and $I_{CT\ disconnection\ locking\ constant\ value}$ is the constant value of CT disconnection locking.

Further, a judgment condition for judging whether the variation of the current brake current meets the feature of decreasing in Step 2 is as follows:

$$|I_{r(i-2T)}-I_{r(i-4T)}|>|I_{r(i)}-I_{r(i-2T)}|+I_{mk2},$$

where $I_{r(i)}$ is a value of the current differential current, $I_{r(i-2T)}$ is a value of a differential current of a cycle which is located before the current cycle and separated from the current cycle by one cycle, $I_{r(i-4T)}$ is a value of a differential current of a cycle which is located before the current cycle and separated from the current cycle by three cycles, and $I_{mk2}$ is a fixed threshold value.

Further, a criterion for judging, interval by interval, whether the current load current abruptly varies in Step 1 is as follows:

$$|I_{fh(i-2T)}-I_{fh(i-4T)}|>|I_{fh(i)}-I_{fh(i-2T)}|+I_{mk},$$

where $I_{fh(i)}$ is a current load current, $I_{fh(i-2T)}$ is a load current of a cycle which is located before the current cycle and separated from the current cycle by one cycle, $I_{fh(i-4T)}$ is a load current of a cycle which is located before the current cycle and separated from the current cycle by three cycles, and $I_{mk}$ is a fixed threshold value.

Further, a judgment condition for judging whether the targeted interval varies from the state in which there is the load current to the state in which there is no current in Step 3 is as follows:

$$|I_{fh\cdot A}|<0.04I_n \text{ or } |I_{fh\cdot B}|<0.04I_n \text{ or } |I_{fh\cdot C}|<0.04I_n,$$

where $I_{fh\cdot A}$ is a value of an A-phase load current of the targeted interval, $I_{fh\cdot B}$ is a value of an B-phase load current of the targeted interval, $I_{fh\cdot C}$ is a value of an C-phase load current of the targeted interval, and $I_n$ is a current threshold value.

Further, a condition for judging whether the variation in the current load current per cycle of the targeted interval is equal to the variation in the current differential current per cycle in Step 3 is as follows:

$$||I_{fh(i)}-I_{fh(i-2T)}|-|I_{cd(i)}-I_{cd(i-2T)}||<0.06I_n,$$

where $I_{fh(i)}$ is a value of a current load current, $I_{fh(i-2T)}$ is a value of load current of a cycle which is located before the current cycle and separated from the current cycle by one cycle, $I_{cd(i)}$ is a value of the current differential current, $I_{cd(i-2T)}$ is a value of a differential current of a cycle which is located before the current cycle and separated from the current cycle by one cycle, and $I_n$ is a current threshold value.

Compared with the conventional art, the present disclosure has the beneficial effects as follows.

The present disclosure provides a method for quickly identifying disconnection of a CT in protection of a 3/2 connection mode based bus. In the present disclosure, a three-phase differential current and three-phase brake current of each of the branches of a high voltage bus are calculated, it is judged whether a load current abruptly varies interval by interval, and the interval is targeted. Then, it is sequentially judged whether the differential current, the brake current and the load current at the targeted interval are 0 and whether a variation of the load current is equal to that of the differential current; if the judgment conditions are met, it is judged that a disconnection of the CT occurs at the interval. Due to of the fact that composite voltage locking is not adopted for differential protection of 3/2 connection mode based bus protection, the present disclosure can quickly and accurately identify the disconnection of the CT, thereby avoiding the problem of a maloperation in protection of a bus caused by the disconnection of the CT.

BRIEF DESCRIPTION OF THE DRAWINGS

FIG. 1 is a flow chart showing a principle of an embodiment of the present disclosure.

DETAILED DESCRIPTION

The present disclosure will be further described in detail below in conjunction with the drawings and the embodiment.

The present disclosure provides a method for quickly identifying disconnection of a CT in protection of a 3/2 connection mode based bus. FIG. 1 shows a flow of judgment, which includes the following specific steps.

1. Sample values of three-phase differential currents and three-phase brake currents of all running branches on a bus are calculated, wherein each three-phase differential current is a vector sum (Formula (1)) of sampling currents of each branch, and each three-phase brake current is a scalar sum (Formula (2)) of the sampling currents of each branch:

Differential current:

$$i_d = \sum_{j=1}^{n} i_j \qquad (1)$$

Brake current:

$$i_r = \sum_{j=1}^{n} |i_j| \qquad (2)$$

2. It is judged whether a load current varies abruptly. Specifically, a variation of a value of a current sample of a current point with respect to a value of a current sample obtained in a cycle, which is located before the current cycle and separated from the current cycle by one cycle, is compared with a variation of the value of the current sample obtained in the cycle, which is located before the current cycle and separated from the current cycle by one cycle with respect to a value of a current sample obtained in a cycle, which is located before the current cycle and separated from the current cycle by three cycles. If the differential current increases, it is indicated that a difference current is generated. If the following criterion (Formula (2)) is met, it is proved that the currents of the branches abruptly vary. When the differential current of only one branch abruptly varies, a serial number of the interval is targeted, and the following steps are performed. The criterion for judging whether the currents of the branches abruptly vary is as follows:

$$|I_{fh(i-2T)}-I_{fh(i-4T)}|>|I_{fh(i)}-I_{fh(i-2T)}|+I_{mk} \qquad (3),$$

where $I_{fh(i)}$ is a value of a load current of a current point, $I_{fh(i-2T)}$ is a value of a load current of a cycle, which is located before the current cycle and separated from the current cycle by one cycle, of this point, $I_{fh(i-4T)}$ is a load current of a cycle, which is located before the current cycle and separated from the current cycle by three cycles, of this point, and $I_{mk}$ is a fixed threshold value. The fixed threshold value is introduced in comparison of the two variations for preventing that differential current is misjudged to be increased due to a difference current generated from unbalanced currents.

3. It is judged whether a variation in a current differential current per cycle is larger than a constant value of CT disconnection locking. That is, a variation of a value of a current sample of a differential current of a current point with respect to a value of a current sample obtained in a cycle, which is located before the current cycle and separated from the current cycle by one cycle, is compared with a variation of the value of the current sample obtained in a cycle, which is located before the current cycle and separated from the current cycle by one cycle, with respect to a value of a current sample obtained in a cycle, which is located before the current cycle and separated from the current cycle by three cycles. A criterion is shown as Formula (4):

$$|I_{cd(i)}-I_{cd(i-2T)}|>|I_{cd(i-2T)}-I_{cd(i-4T)}|+ \\ I_{CT\ disconnection\ locking\ constant\ value} \qquad (4),$$

where $I_{cd(i)}$ is a value of a differential current of a current point, $I_{cd(i-2T)}$ is a value of a differential current of a cycle, which is located before the current cycle and separated from the current cycle by one cycle, of this point, $I_{cd(i-4T)}$ is a value of a differential current of a cycle, which is located before the current cycle and separated from the current cycle by three cycles, of this point, and $I_{CT\ disconnection\ locking\ constant\ value}$ is a constant value of CT disconnection locking. If the current of the current point meets the criterion (Formula (4)), that is, an increased amplitude is larger than the constant value of CT disconnection locking, the next step is performed.

4. It is judged whether a current brake current meets a feature of decreasing. That is, a variation of a value of a current sample of a brake current of a current point with respect to a value of a current sample obtained in a cycle, which is located before the current cycle and separated from the current cycle by one cycle, is compared with a variation of the value of the current sample obtained in the cycle, which is located before the current cycle and separated from the current cycle by one cycle, with respect to a value of a current sample obtained in a cycle, which is located before the current cycle and separated from the current cycle by three cycles. A criterion is shown as Formula (5):

$$|I_{r(i-2T)}-I_{r(i-4T)}|>|I_{r(i)}-I_{r(i-2T)}|+I_{mk2} \quad (5),$$

where $I_{r(i)}$ is a differential current value of a current point, $I_{r(i-2T)}$ is a value of a differential current of a cycle, which is located before the current cycle and separated from the current cycle by one cycle, of this point, $I_{r(i-4T)}$ is a value of a differential current of a cycle, which is located before the current cycle and separated from the current cycle by three cycles, of this point, and $I_{mk2}$ is a fixed threshold value in Formula (5). The fixed threshold value $I_{mk2}$ is introduced in comparison of the two variations for preventing the differential current is misjudged to be increased due to a difference current generated from unbalanced currents. If the current of the current point meets the criterion (Formula (5)), the next step is performed.

5. A load current at the targeted interval is calculated using a full-cycle Fourier algorithm for judging whether the targeted interval varies from a state in which there is the load current to a state in which there is no current. A criterion is as follows:

$$|I_{fh\cdot A}|<0.04I_n \text{ or } |I_{fh\cdot B}|<0.04I_n \text{ or } |I_{fh\cdot C}|<0.04I_n \quad (6),$$

where $I_{fh\cdot A}$ is a value of an A-phase load current of a current point, $I_{fh\cdot B}$ is a value of a B-phase load current of the current point, $I_{fh\cdot C}$ is a value of a C-phase load current of the current point. If the current of the current point meets the criterion (Formula (6)), the next step is performed.

6. It is judged a feature where a variation of a load current is equal to a variation of a differential current in the targeted interval. A criterion is as follows:

$$||I_{fh(i)}-I_{fh(i-2T)}|-|I_{cd(i)}-I_{cd(i-2T)}||<0.06I_n \quad (7),$$

where $I_{fh(i)}$ is a value of a load current of a current point, $I_{fh(i-2T)}$ is a value of a load current of a cycle, which is located before the current cycle and separated from the current cycle by one cycle, of this point, $I_{cd(i)}$ is a value of a differential current of the current point, $I_{cd(i-2T)}$ is a value of a differential current of a cycle, which is located before the current cycle and separated from the current cycle by one cycle, of this point, and $I_n$ is a current threshold value. In order to eliminate influence caused by unbalanced currents, a non-current threshold. If the criterion (Formula (7)) is met, it can be judged that the disconnection of the CT occurs at the targeted interval, and corresponding measures are taken.

The number of sampling points in judgment in the present embodiment matches sampling value differential protection. Generally, the sampling value differential protection is taking 6 from 12, so the number of points meeting the criteria in Steps 1 and 4 may be set as 5. When five successive points meet the criteria, it is judged that a CT disconnection criterion is pre-met, and in this case, differential protection action logics are forcibly strung into a time delay of 20 ms to wait for judgments in Steps 5 and 6.

The present embodiment where two cycles serve as the period of a current cycle is only a preferred embodiment, and is not intended to limit the present disclosure. As other implementations, other sampling values can be selected to calculate variations of differential currents and brake currents, similarly.

Under an idea provided in the present disclosure, a technical way in the above embodiment is converted, replaced and modified using a mode easily thought by those skilled in the art; moreover, achieved functions and purposes are basically the same as those of corresponding technical ways in the present disclosure, a technical solution formed thereby is formed by slightly adjusting the above embodiment, and the technical solution still falls within the protective scope of the present disclosure.

What is claimed is:

1. A method for quickly identifying disconnection of a Current Transformer (CT) in protection of 3/2 connection mode based bus, characterized by comprising:
   Step 1, collecting currents of all running branches on a current bus, calculating a current differential current and brake current, then judging, interval by interval, whether a load current abruptly varies, and if the load current of only one branch abruptly varies, targeting the interval;
   Step 2, judging whether a variation of the current differential current in Step 1 is larger than a constant value of CT disconnection locking, and judging whether a variation of the current brake current meets a feature of decreasing;
   Step 3, judging whether the targeted interval in Step 1 varies from a state in which there is the load current to a state in which there is no current, and judging whether a variation in a current load current per cycle of the targeted interval is equal to a variation in a current differential current per cycle;
   Step 4, if the above judgment conditions in Steps 2 and 3 are met, judging that the disconnection of the CT occurs at the targeted interval.

2. The method for quickly identifying the disconnection of the CT in the protection of the 3/2 connection mode based bus of claim 1, wherein the differential current in Step 1 is a vector sum of the currents of all the branches, and the brake current is a scalar sum of the currents of all the branches.

3. The method for quickly identifying the disconnection of the CT in the protection of the 3/2 connection mode based bus of claim 1, wherein a criterion for judging whether the variation of the current differential current is larger than the constant value of CT disconnection locking in Step 2 is as follows:

$$|I_{cd(i)}-I_{cd(i-2T)}|>|I_{cd(i-2T)}-I_{cd(i-4T)}|+I_{constant\ value\ of\ CT\ disconnection\ locking},$$

where $I_{cd(i)}$ is a value of the current differential current, $I_{cd(i-2T)}$ is a value of a differential current of a cycle which is located before the current cycle and separated from the current cycle by one cycle, $I_{cd\ (i-4T)}$ is a value of a differential current of a cycle which is located before the current cycle and separated from the current cycle by three cycles, and $I_{CT\ disconnection\ locking\ constant\ value}$ is the constant value of CT disconnection locking.

4. The method for quickly identifying the disconnection of the CT in the protection of the 3/2 connection mode based bus of claim 1, wherein a judgment condition for judging whether the variation of the current brake current meets the feature of decreasing in Step 2 is as follows:

$$|I_{r(i-2T)}-I_{r(i-4T)}|>|I_{r(i)}-I_{r(i-2T)}|+I_{mk2},$$

where $I_{r(i)}$ is a value of the current brake current, $I_{r(i-2T)}$ is a value of a brake current of a cycle which is located before the current cycle and separated from the current cycle by one cycle, $I_{r(i-4T)}$ is a value of a brake current of a cycle which is located before the current cycle and separated from the current cycle by three cycles, and $I_{mk2}$ is a fixed threshold value.

5. The method for quickly identifying the disconnection of the CT in the protection of the 3/2 connection mode based bus of claim 1, wherein a judgment condition for judging whether the variation of the current brake current meets the feature of decreasing in Step 2 is as follows:

$$|I_{r(i-2T)} - I_{r(i-4T)}| > |I_{r(i)} - I_{r(i-2T)}| + I_{mk2},$$

where $I_{r(i)}$ is a value of the current brake current, $I_{r(i-2T)}$ is a value of a brake current of a cycle which is located before the current cycle and separated from the current cycle by one cycle, $I_{r(i-4T)}$ is a value of a brake current of a cycle which is located before the current cycle and separated from the current cycle by three cycles, and $I_{mk2}$ is a fixed threshold value.

6. The method for quickly identifying the disconnection of the CT in the protection of the 3/2 connection mode based bus of claim 1, wherein a judgment condition for judging whether the targeted interval varies from the state in which there is the load current to the state in which there is no current in Step 3 is as follows:

$$|I_{fh \cdot A}| < 0.04 I_n \text{ or } |I_{fh \cdot B}| < 0.04 I_n \text{ or } |I_{fh \cdot C}| < 0.04 I_n,$$

where $I_{fh \cdot A}$ is a value of an A-phase load current of the targeted interval, $I_{fh \cdot B}$ is a value of an B-phase load current of the targeted interval, $I_{fh \cdot C}$ is a value of an C-phase load current of the targeted interval, and $I_n$ is a current threshold value.

7. The method for quickly identifying the disconnection of the CT in the protection of the 3/2 connection mode based bus of claim 1, wherein a condition for judging whether the variation in the current load current per cycle of the targeted interval is equal to the variation in the current differential current per cycle in Step 3 is as follows:

$$||I_{fh(i)} - I_{fh(i-2T)}| - |I_{cd(i)} - I_{cd(i-2T)}|| < 0.06 I_n,$$

where $I_{fh(i)}$ is a value of a current load current, $I_{fh(i-2T)}$ is a value of a load current of a cycle which is located before the current cycle and separated from the current cycle by one cycle, $I_{cd(i)}$ is a value of the current differential current, $I_{cd(i-2T)}$ is a value of a differential current of a cycle which is located before the current cycle and separated from the current cycle by one cycle, and $I_n$ is a current threshold value.

* * * * *